United States Patent
Lu et al.

(10) Patent No.: US 9,170,303 B2
(45) Date of Patent: Oct. 27, 2015

(54) SYSTEM AND METHOD TO DETERMINE ELECTRIC MOTOR EFFICIENCY USING AN EQUIVALENT CIRCUIT

(75) Inventors: Bin Lu, Kenosha, WI (US); Thomas G. Habetler, Snellville, GA (US)

(73) Assignee: Eaton Corporation, Cleveland, OH (US)

( * ) Notice: Subject to any disclaimer, the term of this patent is extended or adjusted under 35 U.S.C. 154(b) by 1227 days.

(21) Appl. No.: 13/088,846

(22) Filed: Apr. 18, 2011

(65) Prior Publication Data

US 2011/0213589 A1     Sep. 1, 2011

Related U.S. Application Data

(62) Division of application No. 12/132,194, filed on Jun. 3, 2008, now Pat. No. 7,956,637.

(60) Provisional application No. 60/959,459, filed on Jul. 13, 2007, provisional application No. 60/932,741, filed on Jun. 4, 2007.

(51) Int. Cl.
*G01R 31/34* (2006.01)
*H02P 23/14* (2006.01)

(52) U.S. Cl.
CPC .............. *G01R 31/343* (2013.01); *H02P 23/14* (2013.01)

(58) Field of Classification Search
CPC .... G01R 27/2611; H02P 23/14; H02P 29/028
USPC ................ 324/765.01, 537, 545; 702/38, 182
See application file for complete search history.

(56) References Cited

U.S. PATENT DOCUMENTS

| | | | |
|---|---|---|---|
| 4,672,288 A | 6/1987 | Abbondanti | |
| 5,659,232 A | 8/1997 | Benning | |
| 6,042,265 A | 3/2000 | Kliman et al. | |
| 6,236,947 B1 * | 5/2001 | Dowling et al. | 702/38 |
| 6,308,140 B1 | 10/2001 | Dowling et al. | |
| 6,470,301 B1 * | 10/2002 | Barral | 703/1 |
| 6,822,839 B2 * | 11/2004 | Habetler | 361/30 |
| 6,862,538 B2 | 3/2005 | El-Ibiary | |
| 7,135,830 B2 * | 11/2006 | El-Ibiary | 318/561 |
| 7,184,902 B2 * | 2/2007 | El-Ibiary | 702/60 |

(Continued)

OTHER PUBLICATIONS

Hurst et al., "A Comparison of Spectrum Estimation Techniques for Sensorless Speed Detection in Induction Machines," IEEE Transactions on Industry Applications, vol. 33, No. 4, Jul./Aug. 1997, pp. 898-905.

(Continued)

*Primary Examiner* — Tung X Nguyen
*Assistant Examiner* — Giovanni Astacio-Oquendo
(74) *Attorney, Agent, or Firm* — Ziolkowski Patent Solutions Group, SC (57) ABSTRACT

A system and method for determining electric motor efficiency includes a monitoring system having a processor programmed to determine efficiency of an electric motor under load while the electric motor is online. The determination of motor efficiency is independent of a rotor speed measurement. Further, the efficiency is based on a determination of stator winding resistance, an input voltage, and an input current. The determination of the stator winding resistance occurs while the electric motor under load is online.

14 Claims, 6 Drawing Sheets

(56) References Cited

U.S. PATENT DOCUMENTS

| | | | |
|---|---|---|---|
| 7,499,816 B2* | 3/2009 | Scholtz et al. | 702/60 |
| 7,560,895 B2* | 7/2009 | Arnet | 318/778 |
| 7,650,819 B2* | 1/2010 | Haynes et al. | 74/606 R |
| 7,769,552 B2* | 8/2010 | Colby et al. | 702/65 |
| 2002/0079859 A1 | 6/2002 | Lumsden | |
| 2003/0074146 A1* | 4/2003 | Stoupis et al. | 702/58 |
| 2007/0124093 A1* | 5/2007 | Choi et al. | 702/59 |
| 2007/0182350 A1 | 8/2007 | Patterson et al. | |

OTHER PUBLICATIONS

Hurst et al., "A Self-Tuning Closed-Loop Flux Observer for Sensorless Torque Control of Standard Induction Machines," IEEE Transactions on Power Electronics, vol. 12, No. 5, Sep. 1997, pp. 807-815.

Lee et al., "An On-line Stator Winding Resistance Estimation Technique for Temperature Monitoring of Line-connected Induction Machines," IEEE, 2001, pp. 1564-1571.

Hsu et al., "Comparison of Induction Motor Field Efficiency Evaluation Methods," IEEE Transactions on Industry Applications, vol. 34, No. 1, Jan./Feb. 1998, pp. 117-125.

"IEEE Standard Test Procedure for Polyphase Induction Motors and Generators," IEEE Standards, IEEE Power Engineering Society, New York, New York, Nov. 4, 2004.

Kueck et al., "Assessment of methods for estimating motor efficiency and load under field conditions," Oak Ridge National Laboratory report, ORNL/TM-13165, 1996.

Hurst et al., "Sensorless Speed Measurement Using Current Harmonic Spectral Estimation in Induction Machine Drives," IEEE Transactions on Power Electronics, vol. 11, No. 1, Jan. 1996, pp. 66-73.

\* cited by examiner

SYSTEM AND METHOD TO DETERMINE ELECTRIC MOTOR EFFICIENCY USING AN EQUIVALENT CIRCUIT

CROSS-REFERENCE TO RELATED APPLICATIONS

The present application is a divisional of, and claims priority to, U.S. application Ser. No. 12/132,194 filed Jun. 3, 2008, the disclosure of which is incorporated herein by reference, and which further claimed the benefit of both prior U.S. Provisional Application Ser. No. 60/932,741 filed Jun. 4, 2007 and of prior U.S. Provisional Application Ser. No. 60/959,459 filed Jul. 13, 2007.

GOVERNMENT LICENSE RIGHTS

The present invention was made at least in part with Government support under Contract No. DE-FC36-04GO14000, awarded by the United States Department of Energy. The Government may have certain rights in the invention.

BACKGROUND OF THE INVENTION

The invention relates generally to the determination of an electric motor's operating efficiency while the motor is running without the need for any additional sensors, other than standard current and voltage sensors on the input side of the motor.

Motor-driven systems are generally believed to use a majority of the total electric energy produced. Of the total number of motor-driven systems in use, only a small fraction have their efficiency and health monitored. Due to the costs of conventional monitoring systems, the motor-driven systems that are monitored are often the costlier motors above 500 hp. However, motors below 200 hp make up a majority of the motors in service and consume a majority of the energy used by all motors in service. Further, these motors of 200 hp or below often operate at no more than 60% of their rated load because of oversized installations and/or under-loaded conditions. Consequently, many motors operate at a reduced efficiency, which results in wasted energy. Without an efficiency monitoring system, the wasted energy that results from a motor operating inefficiently often goes unnoticed. Accordingly, often the first step towards maximizing energy efficiency of a motor is to determine or measure the efficiency of the motor.

Systems for energy usage monitoring or efficiency evaluation of electric machines are important for overall energy savings. These systems are often expected to be implemented in an integrated product because of many common requirements such as data collections. At a fundamental level, energy efficiency of a motor can be determined by the ratio of a motor's power input to the motor's power output. Motor terminal voltages and currents are often used to determine a motor's power input. In industrial plants, the motor terminal voltages and currents are readily available from motor control centers (MCCs) that have potential transformers (PTs) and current transformers (CTs) preinstalled for protection purposes. Because of the PTs and CTs that are often preinstalled in MCCs, to measure terminal voltages and currents often brings no additional costs in terms of added sensors for data collection. As such, conventional efficiency monitoring systems often rely on the terminal voltages and currents as measured by the MCCs to determine input power. However, many traditional efficiency evaluation methods or monitoring systems also require the measurement of motor rotor speed and motor shaft torque so that motor output power may be calculated. Speed and torque transducers are commonly used to directly measure the motor rotor speed and shaft torque. However, such transducers pose problems because they add expenses in added hardware and costly installations that are highly intrusive requiring motor down-time, which is unacceptable in many industrial applications.

Further, it may not even be possible to install such transducers, or other measuring equipment, because either the motors are buried and inaccessible inside a machine or there is no space to attach such transducers between the motor and the load. As such, methods have been developed in which motors are taken offline or removed from service so that power output may be determined. Often, the motors are removed to a remote room where testing is implemented in a controlled environment. However, because many industrial processes cannot be interrupted, traditional methods that require a motor be removed from service to determine its efficiency cannot be used.

A possible approach of evaluating motor efficiency, while keeping a motor in-service or online and avoiding the use of output transducers, is to use the pre-measured motor characteristic efficiencies for representative load conditions. Such efficiencies are often measured during motor development, and are used to predict the motor efficiency while the motor is in operation, or while in-service. This approach is nonintrusive in nature; however, its usage in practice is greatly limited by the fact that 1) the characteristic efficiencies under representative load conditions are not always available from motor data sheets, and 2) the characteristic efficiencies are generic data for a line of motors. Being generic, such information could differ from actual efficiencies for a specific motor due to many factors, such as winding characteristics, wide tolerances, inaccurate nameplate information, and different working environments, to name just a few reasons.

Therefore, it would be desirable to design an apparatus and method to non-intrusively and accurately determine motor efficiency while such motor is in-service, without the need for any add-on sensors.

BRIEF DESCRIPTION OF THE INVENTION

In accordance with one aspect of the invention, a motor efficiency monitoring system includes a processor programmed to determine efficiency of an electric motor under load while the electric motor is online. The determination of motor efficiency is independent of a rotor speed measurement. Further, the efficiency is based on a determination of stator winding resistance, an input voltage, and an input current. The determination of the stator winding resistance occurs while the electric motor under load is online.

In accordance with another aspect of the invention, a computer readable storage medium having stored thereon a computer program comprising instructions, which, when executed by a computer, cause the computer to determine an input power of an operating electric motor online, determine an output power of the operating electric motor online, and determine a motor efficiency of the operating electric motor online. The determination of the motor efficiency is based on the motor input power and the output power. The determination of the output power is based on a determination of a stator resistance. The determination of the stator resistance is based on at least one of a motor input power, a motor input current, and a rotor speed.

In accordance with yet another aspect of the invention, a method for determining a motor efficiency includes determining a voltage input into a stator of an electric motor in operation, determining a stator resistance of the electric motor in operation based on the voltage, and determining the motor efficiency of the electric motor in operation independent of a stator resistance measurement. Determining the instantaneous motor efficiency is based on the voltage, the stator resistance, and a rotor speed.

Various other features and advantages will be made apparent from the following detailed description and the drawings.

BRIEF DESCRIPTION OF THE DRAWINGS

The drawings illustrate several embodiments contemplated for carrying out the invention.

In the drawings.

DETAILED DESCRIPTION OF THE PREFERRED EMBODIMENT

Figure 1:
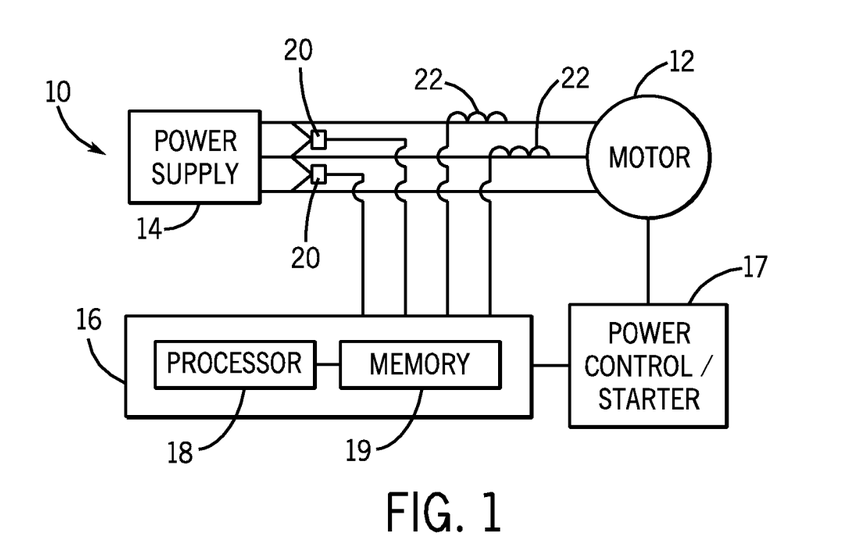
FIG. 1 is a block diagram of a system incorporating the invention.

Referring to FIG. 1, a block diagram of a system incorporating the present invention is shown. The system 10 includes a motor 12 that receives power from a power supply 14. The system 10 also includes a relay assembly 16 used to monitor as well as control operation of the motor in response to operator inputs or motor fault conditions. The motor 12 and the relay assembly 16 typically are coupled to electronic devices such as a power controller and/or a starter 17. The controller/starter 17 is connected to the motor 12. It is contemplated, however, that the power controller/starter may be connected in series between the power supply 14 and the motor 12. In a three-phase system, as shown in FIG. 1, the relay assembly 16 includes a processor 18 and a memory module 19. As will be described in greater detail with respect to FIGS. 2-7, the processor 18 determines motor efficiency while the motor 12 is online and in operation. The memory module 19 has stored thereon multiple numerical solving techniques, which will also be described in greater detail with respect to FIG. 5-7. Though the processor 18 is depicted as being included in the relay assembly 16, it is contemplated that a power control device such as the power controller/starter 17 may include the processor 18. Further, it is also contemplated that the memory module 19 may be positioned in other areas of the system 10. The relay assembly 16 includes at least a pair of voltage sensors 20 and a pair of current sensors 22. As is generally known, voltage and current data may be acquired from only two of the phases of a three-phase motor as voltage and current data for the third phase may be extrapolated from the voltage and current data of the monitored two phases.

It is contemplated that embodiments of the invention may be implemented using a standalone monitoring and diagnostic unit such as the relay assembly 16 of FIG. 1 that includes the processor 18. However, it is also contemplated that embodiments of the invention may be implemented by using existing processors and sensors of a motor control center (MCC). In addition, embodiments of the invention may also be implemented in systems other than the system 10 shown in FIG. 1 that includes the electric motor 12. That is, embodiments of the invention may be implemented with motors that are not three-phase motors.

Figure 2:
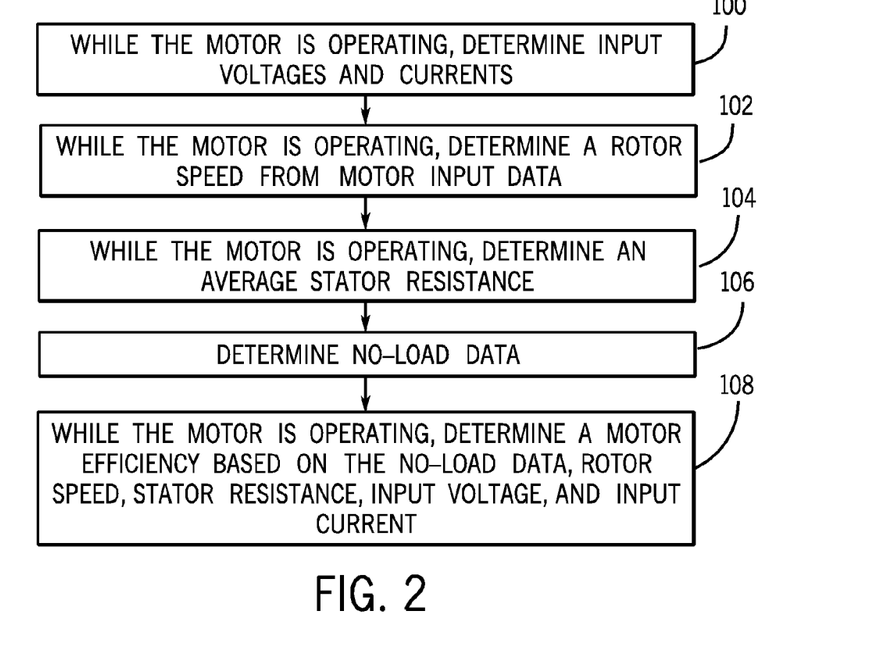
FIG. 2 is a flow chart depicting a technique for a nonintrusive determination of motor efficiency according to the invention.

Referring to FIG. 2, a flowchart depicting a technique for a nonintrusive determination of motor efficiency according to one aspect of the invention is shown. In one embodiment, a plurality of input voltages and currents of the motor's stator are determined or measured while the motor is operating 100. For example, input currents and voltages may be determined using sensors at the input terminals of the motor, or at any convenient location upstream of the motor so as to easily acquire the input voltages and currents using sensors already in place. In yet another example, the input voltages and currents may be determined by using detectors or sensors to determine line-to-line voltages (e.g., see voltage sensors 20 and current sensors 22 of FIG. 1). Often, however, MCCs can be used to determine input voltages and currents using the potential transformers (PTs) and currents transformers (CTs) incorporated therein. Accordingly, if such an MMC is connected to a motor, voltage and current inputs can be gathered or determined therefrom.

In another embodiment, input power and one of a plurality of stator input voltages or input currents are determined or measured at 100, FIG. 2. That is, if a plurality of stator input voltages are determined, one skilled in the art will appreciate that the determined or measured input power may be used to determine the plurality of stator input currents. Likewise, if a plurality stator input currents are determined, one skilled in the art will appreciate that the determined or measure input power may be used to determine the plurality of stator input voltages.

Still referring to FIG. 2, after the determinations or measurements at 100, process control proceeds to determining rotor speed at 102. It is noted that, such rotor speed is determined while the motor is operating and online. Further, it is also noted that the rotor speed is determined using the determined or gathered input currents and motor or electrical input data such as voltages or a determined or gathered input power—not by using any speed transducers or other invasive devices.

Figure 3:
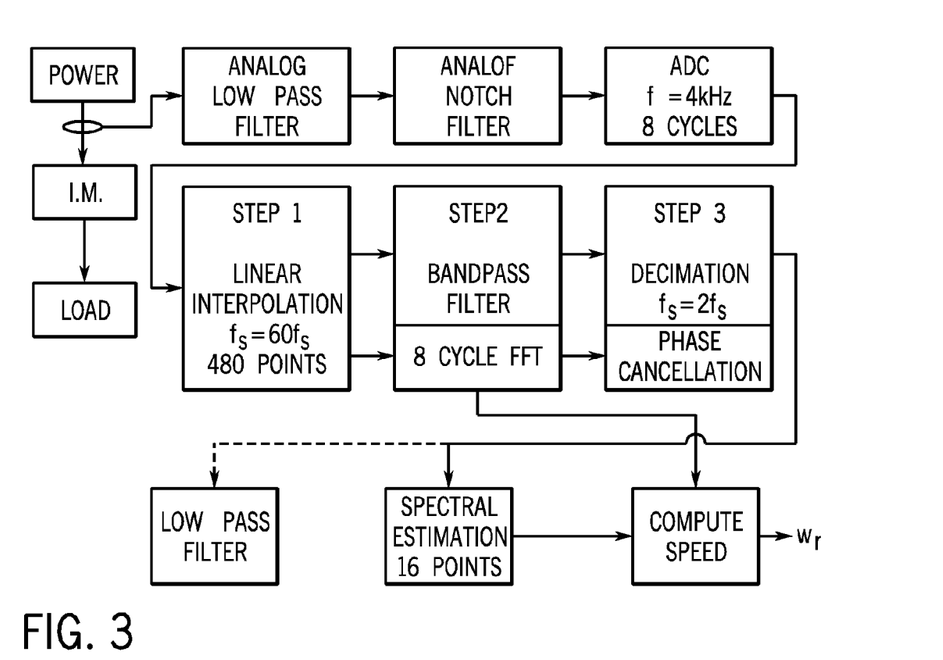
FIG. 3 is an exemplary signal processing diagram illustrating the determination of motor rotor speed used in one embodiment of the invention.

In one embodiment, the rotor speed is determined, 102, using determined input voltages and currents and is based on current harmonics. That is, the determination at 102 may be based on the motor magnetic saliency harmonics, which arise from rotor slotting and eccentricity. For example, an initialization algorithm, as understood by those skilled in the art, may be used for determining the number of rotor slots and for determining an optimal set of numbers for k, air-gap MMF harmonics order, and an order of rotor eccentricity for the following equation:

$$f_{seh} = f_1 \left[ (kR + n_d)\frac{1-s}{p/2} + n_w \right], \quad \text{(Eqn. 1)}$$

where $f_{seh}$ is the frequency of rotor-related harmonic components; $f_1$ is the supply frequency; k=0, 1, 2, . . . ; R is the number of rotor slots; p is the number of poles; s is the motor slip; $n_d=0, \pm1, \pm2, \ldots$, is the order of rotor eccentricity; and $n_w=\pm1, \pm3, \ldots$, is the air-gap MMF harmonics order. An example of an overall signal processing algorithm, which may used to determine the slot harmonic frequency, $f_{seh}$, is illustrated in the signal processing diagram of FIG. 3. After determining k, $n_d$, and $n_w$, a speed detection algorithm may use the following relationship to determine rotor speed:

$$s = 1 - \frac{p}{2} \cdot \frac{\frac{f_{seh}}{f_1} - n_w}{kR + n_d}. \quad \text{(Eqn. 2)}$$

Here, the slip determination is independent of motor parameters, only requiring the number of poles, which may be obtained a priori. Such a determination provides a robust speed estimate down to approximately 1 Hz operation with a very high accuracy of within 5 rpm at high speeds and 0.005 p.u. slip at low speeds. Other sensorless speed determinations that employ other techniques may be used in a manner consistent with embodiments of the invention.

In another embodiment, the rotor speed, $\omega_r$, of a motor may determined, 102, FIG. 2, using a determined or calculated input power and nameplate data information according to the following relationship:

$$\omega_r = -(\omega_{syn} - \omega_{r\_rated}) \times \text{Load\_per} + \omega_{syn}, \quad \text{(Eqn. 3)}$$

where $\omega_{syn}$ is the motor synchronous speed, $\omega_{r\_rated}$ is the rated motor speed that may be determined from motor nameplate information, and Load_per is the instantaneous load percentage. $\omega_{syn}$ may be determined from the following relationship:

$$\omega_{syn} = \frac{120 \times f_1}{p}, \quad \text{(Eqn. 4)}$$

where p, which may be determined from nameplate data, is the motor pole number, and $f_1$ is, as with Eqn. 1, the fundamental frequency of the supply. Load_per, as used in Eqn. 3, may be determined from the following relationship:

$$\text{Load\_per} = \frac{P_{input}}{P_{input\_rated}} \times 100\%, \quad \text{(Eqn. 5)}$$

where $P_{input}$ may be determined from data gathered from an input power meter. $P_{input\_rated}$, as seen in Eqn. 3, may be determined in accordance with the following relationship:

$$P_{input\_rated} = \frac{HP_{rated} \times 745.7}{\eta_{rated}}, \quad \text{(Eqn. 6)}$$

where $HP_{rated}$ and $\eta_{rated}$ is the rated output power and the rated motor efficiency, respectively, and each may also be determined from nameplate data. Alternatively, $P_{input\_rated}$ may also be determined according to the following relationship:

$$P_{input\_rated} = \sqrt{3} \times V_{LL\_rated} \times I_{s\_rated} \times PF_{rated}, \quad \text{(Eqn. 7)}$$

where $V_{LL\_rated}$ represents the rated line-to-line input voltage determined from motor nameplate, $I_{s\_rated}$ represents rated input phase current or Full Load Current determined from motor nameplate, and $PF_{rated}$ represents the rated motor power factor, also determined from motor nameplate data.

Accordingly, in light of Eqns. 3-7, the instantaneous motor speed, $\omega_r$, may be determined from only nameplate data and a determined motor input power, $P_{input}$. Other sensorless speed determinations that employ other techniques may be used in a manner consistent with embodiments of the invention.

As discussed above, rotor speed determinations may be made without a speed sensor. It is contemplated, however, that a speed sensor may be used to determine rotor speed. As such, a rotor speed determination such as the one discussed above with respect to Eqns. 1 and 2 may be used to verify a rotor speed determined from a sensor.

Figure 4:
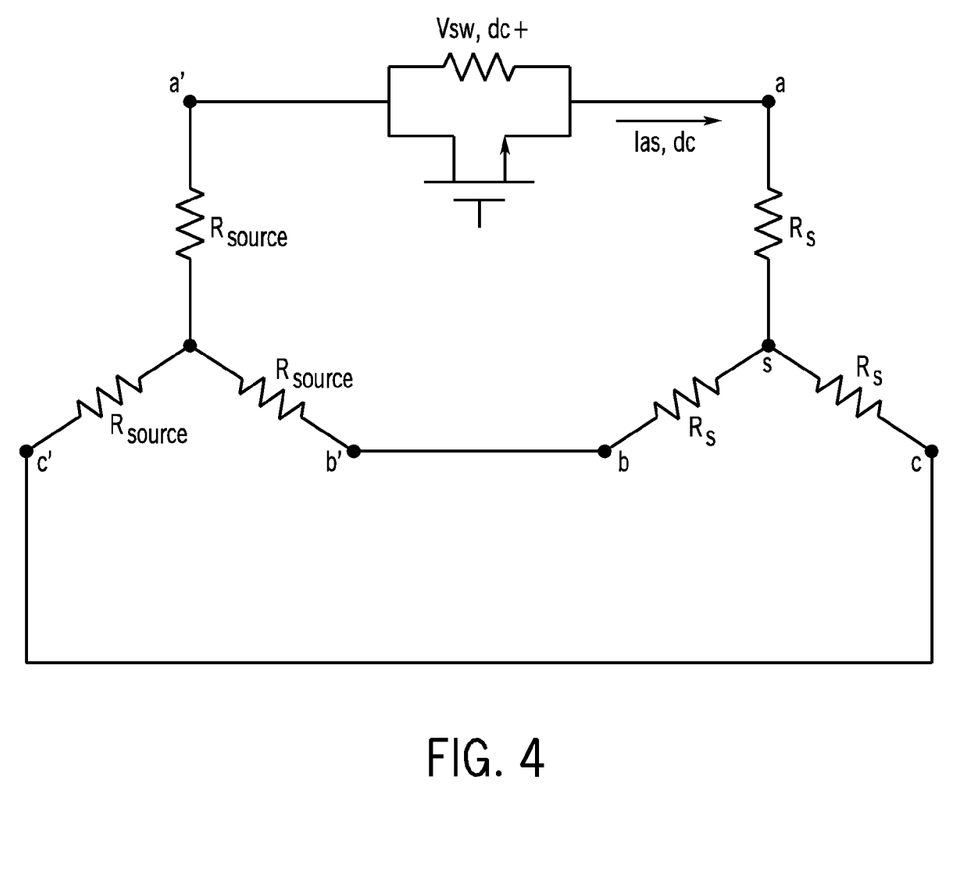
FIG. 4 is an equivalent circuit of a solid-state device used in the determining stator resistance of a motor according to an embodiment of the invention.

Referring back to FIG. 2, upon determining rotor speed, without speed transducers or other invasive devices, process control proceeds to determine an average stator resistance of the motor at 104 while the motor is operating (i.e., while in-service or online). That is, a stator resistance for each phase of the motor is determined and then the three stator resistances are averaged to create the determined average stator resistance. Traditionally, a direct current resistance of a stator winding is measured through an unpowered test. However, according to at least one embodiment of the invention, direct current resistance of a stator winding can be determined while a motor remains powered. That is, according to this embodiment, an average stator resistance may be determined while the motor is in operation. An average stator resistance determination may be determined in a variety of ways. For example, in one embodiment, an injection circuit is utilized, where a solid state device such as a MOSFET controlled circuit is used to intermittently inject a controllable direct current bias into the motor, thus allowing the determination of stator resistance for each phase. An equivalent circuit structure of such a MOSFET controlled circuit is shown in FIG. 4. Such an embodiment allows for low power dissipation and torque distortion, and is capable of providing an accurate average stator resistance determination under motor startup, load variation, and abnormal cooling conditions. Further, in such an embodiment, the injection circuit can be installed in the MCC for mains-fed machines. Upon determining stator resistance with regard to each phase of a motor, an average of the three can be taken to determine the average stator resistance.

Still referring to FIG. 2, when drive-connected motors are used, another embodiment may be employed to determine average stator resistance at 104. As is known in the art, with drive-connected motors, an injection circuit is not needed since direct current signal injection can be implemented in a software mode by controlling the excitation signals. As such, by controlling excitation signals, an average stator resistance can be determined from induced direct-current components in the input voltages and/or currents.

Another embodiment for determining average stator resistance during motor operation without a direct-current signal injection circuit will now be described. For many alternating current motors, which are connected with, for example, drives, soft-starters, and advanced relays, such an additional signal injection device can be eliminated by non-intrusively determining stator resistance for each phase. In such an embodiment, stator resistance may be determined by injecting direct-current components in the motor stator winding by adjusting the switching of the semiconductor devices of motors, such as a thyristor, MOSFET, or IGBT. As such, the direct-current injection circuit may be eliminated. Upon determining stator resistance for each phase, an average stator resistance can be estimated or determined.

In the embodiment depicted in the flowchart of FIG. 2, the rotor speed determination, 102, precedes the average stator resistance determination, 104. It is contemplated, however, that the rotor speed could be determined anytime after the determination of input voltages and currents, 100, and before the motor efficiency determination, which will be described in greater detail below, at 108.

Still referring to FIG. 2, after the determinations at 104 are complete, process control proceeds to determining no-load data at 106. No-load data includes no-load current and no-load losses. Further, the no-load losses include windage and friction losses and stray-load loss. As will be described more fully below, the invention is capable of determining motor efficiencies for motors using determined no-load input current, measured input currents, and measured input voltages.

No-load input current may be determined at 106 in a variety ways. For example, no-load input current can be measured when a motor is operating under a no-load condition. On the other hand, however, no-load current may be estimated as a fixed percentage of the motor nominal current (e.g. 25%-30% of the nominal current) for small and medium motors (e.g., motors less than 200 horsepower). For larger motors, the percentage is often lower.

No-load current may also be determined using a priori data from a source such as the Motor Master Database data maintained by the United States Department of Energy or other databases. As such, no-load current may be determined at 106 either via measurement or by using a priori database information.

In yet another embodiment, no-load input current may be determined from the no-load losses using the following relationship:

$$P_{input\_nl} = (3.5 \sim 4.2) \times HP \times 745.7/100, \quad \text{(Eqn. 8)}$$

where $P_{input\_nl}$ is the no-load loss that is estimated, as shown, as a fixed percentage of the rated output power (e.g. 3.5%-4.2% of the rated output power per the Ontario Hydro Modified Method E), and HP is the rated motor output horsepower.

With regard to the no-load losses that are included in the determination of no-load data at 106, friction and windage losses, $W_{fw}$, may be estimated as a fixed percentage of the rated output power (e.g. 1.2% of the rated output power), as shown in the following relationship:

$$W_{fw} = 1.2 \times HP \times 745.7/100. \quad \text{(Eqn. 9)}$$

Further, the rated stray-load loss, $W_{LL\_rated}$, may be estimated, according to IEEE standard 112, as a fixed percentage of the rated output power as shown below in the Table 1.

TABLE 1

| Machine HP Rating | | Stray-load Loss Percent of Rated Output |
|---|---|---|
| 1-125 hp | 1-90 kW | 1.8% |
| 126-500 hp | 91-375 kW | 1.5% |
| 501-2499 hp | 376-1850 kW | 1.2% |
| 2500 hp and up | 1851 kW and up | 0.9% |

As shown above, losses are often based on a fixed percentage of the motor horsepower rating. Horsepower ratings may be found in a variety of databases or may be gathered from nameplate data.

Still further, as will be shown below with respect to Eqn. 13, rotor stray-load loss, $W_{LLr}$, may be determined from the motor stator input no-load current, $I_{s\_nl}$, rated rotor current, $I_{r\_rated}$, and rotor current, $I_r$. Before discussing the determination of $W_{LLr}$, examples for determining each variable will be described below.

With regard to the motor stator input no load current, $I_{s\_nl}$, upon determining $P_{input\_nl}$, $W_{fw}$, and $W_{LL\_rated}$, the root mean square (RMS) value of the motor stator input no-load current, $I_{s\_nl}$, may be estimated or determined according to the following relationship:

$$I_{s\_nl} = \sqrt{\frac{P_{input\_nl} - W_{fw} - W_{LL\_rated}}{3 * R_s}}, \quad \text{(Eqn. 10)}$$

where, $R_s$ is the stator resistance value that may be determined from a variety of motor databases, or from the motor voltage and current (e.g., see determination of average stator resistance at 104).

The rated rotor current, $I_{r\_rated}$, which may be used to determine the rotor stray-load loss, may be estimated or determined using rated input current, $I_{s\_rated}$, and the input stator no-load current $I_{s\_nl}$, according to the following relationship:

$$I_{r\_rated}\sqrt{I_{s\_rated}^2 - I_{s\_nl}^2}. \quad \text{(Eqn. 11)}$$

In addition, the rotor current, $I_r$, which also may be used to determine the rotor stray-load loss, may be estimated or determined under any load condition using the input current, $I_s$, and the stator no-load current $I_{s\_nl}$, according to the following relationship:

$$I_r = \sqrt{I_s^2 - I_{s\_nl}^2}. \quad \text{(Eqn. 12)}$$

As such, with the understanding that $W_{LL\_rated}$, discussed above with respect to Table 1, is often estimated to be equivalent to the rated rotor stray-load loss, $W_{LLr\_rated}$, the rotor stray-load loss, $W_{LLr}$, may be determined at any load condition according to the following relationship:

$$W_{LLr} = W_{LLr\_rated} \times \left(\frac{I_r}{I_{r\_rated}}\right)^2. \quad \text{(Eqn. 13)}$$

Accordingly, the determination of no-load data at 106 may include the determination of windage and friction loss, $W_{fw}$, and rotor stray-load loss, $W_{LLr}$.

As depicted in the embodiment of FIG. 2 the determination of no-load data, 106, occurs after the determination of the stator resistance at 104. It is contemplated, however, that the no-load data, 106, could be determined before the determination of stator resistance, 104. That is, if a stator resistance determination is not used in the determination of no-load data, the determination of no-load data, 106, may occur prior to the determination of stator resistance, 104, and after the determination of input voltages and currents at 100.

As mentioned above, the determination of motor efficiency occurs at 108 in the embodiment of FIG. 2. Such an efficiency estimation or determination is considered an instantaneous motor efficiency determination. In one embodiment, the following relationship may be used to determine motor efficiency at 108:

$$\eta = \frac{P_{output}}{P_{input}}, \quad \text{(Eqn. 14)}$$

where η is motor efficiency, $P_{output}$ is the power output of the motor, and $P_{input}$ is the power input of the motor. In one embodiment that will be discussed below with respect to FIGS. 5-7, the motor efficiency determination of 108 is based on a motor parameter technique. As discussed above, in light of the manner in which the motor power input and motor power output may be determined, motor efficiency may be determined or estimated without any output sensing devices.

Figure 5:
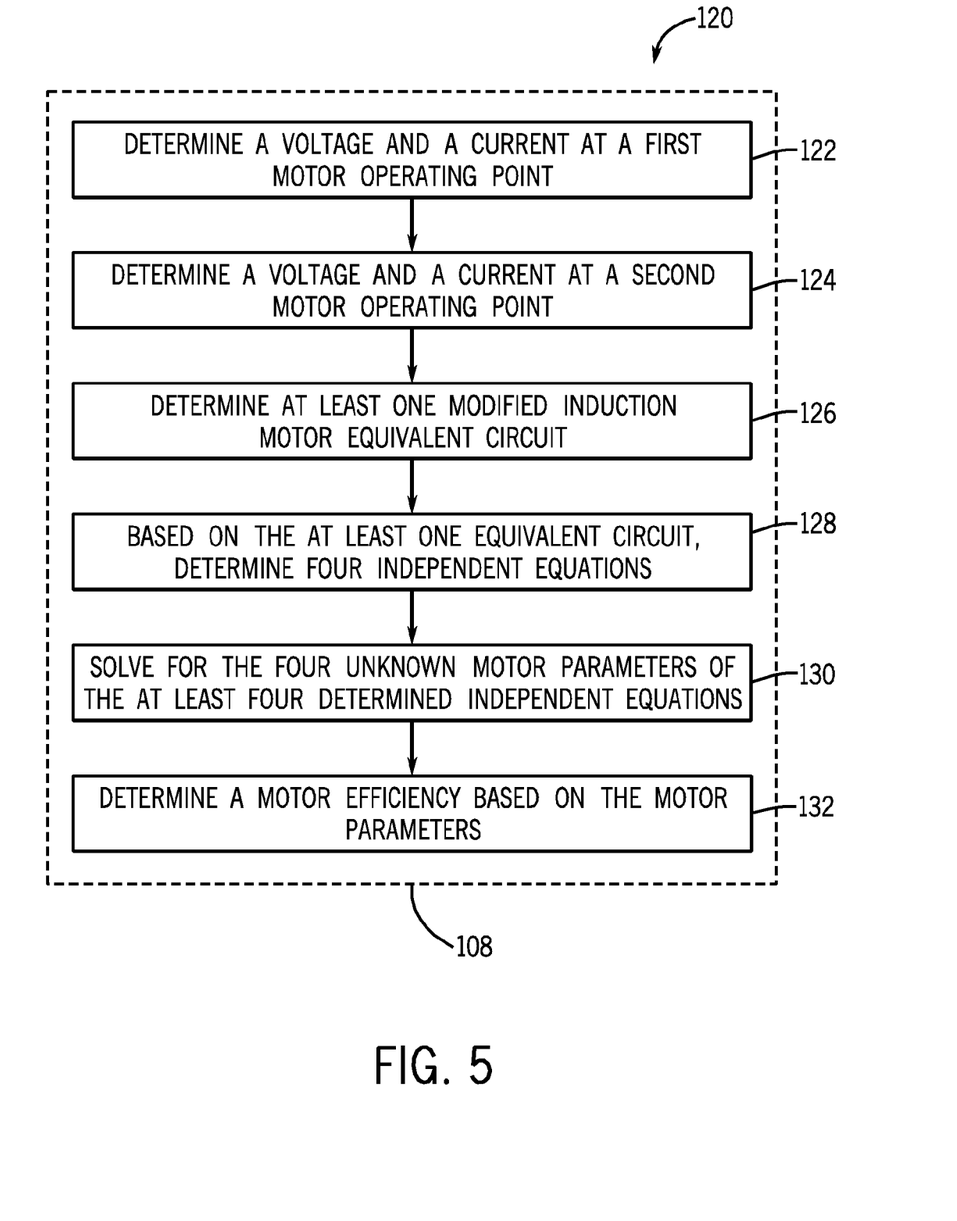
FIG. 5 is a flowchart depicting a technique for a nonintrusive determination of motor efficiency set forth in FIG. 2 according to an embodiment of the invention.

Referring now to FIG. 5, a flowchart depicts technique 120 for the in-service or online determination of motor efficiency 108 according to an embodiment of the invention. More particularly, a non-intrusive parameter based technique 120 for determining a motor efficiency of an induction motor is shown. According to technique 120, an induction motor's input voltage and current relative to a first operating point or load are determined at 122. Process control then proceeds to 124 to determine the motor's input voltage and current relative to a second operating point or load. To serve as an example with regard to the operating points of 122 and 124, the first operating point or load could be at 25% of the maximum rated operating load, and the second operating point or load could be at 75% of the maximum rated operating load. Regardless of the operating points used, such operating points may be chosen by an operator or they may be hard set into a processor (e.g., processor 18 of FIG. 1). In one embodiment, voltage and current sensors such as voltage sensors 20 and current sensors 22 of FIG. 1 may be used to determine the input voltages and currents at 120 and 122 of FIG. 5. In another embodiment, it is contemplated that the input voltages and currents may be gathered from an MCC. As such, it is contemplated that voltages and currents determined at 100 of FIG. 2 could satisfy 122 and 124 of FIG. 5.

The determined input voltages and currents from 122 and 124 are used to determine the appropriate phasors such that at least one modified equivalent circuit may be determined therefrom at 126. It is contemplated, however, that input voltages and currents, and thus their corresponding phasors, may be determined from more than two load points. In such an instance, regression methods such as Least Square Estimation (LSE) can be used to estimate unknown parameters from redundant data. The determined equivalent circuit is a hypothetical circuit representation, which will be used to determine or solve for the motor parameters at 130, which will be more fully discussed below. Two exemplary equivalent circuits are shown, one in FIG. 6 and one in FIG. 7.

Figure 6:
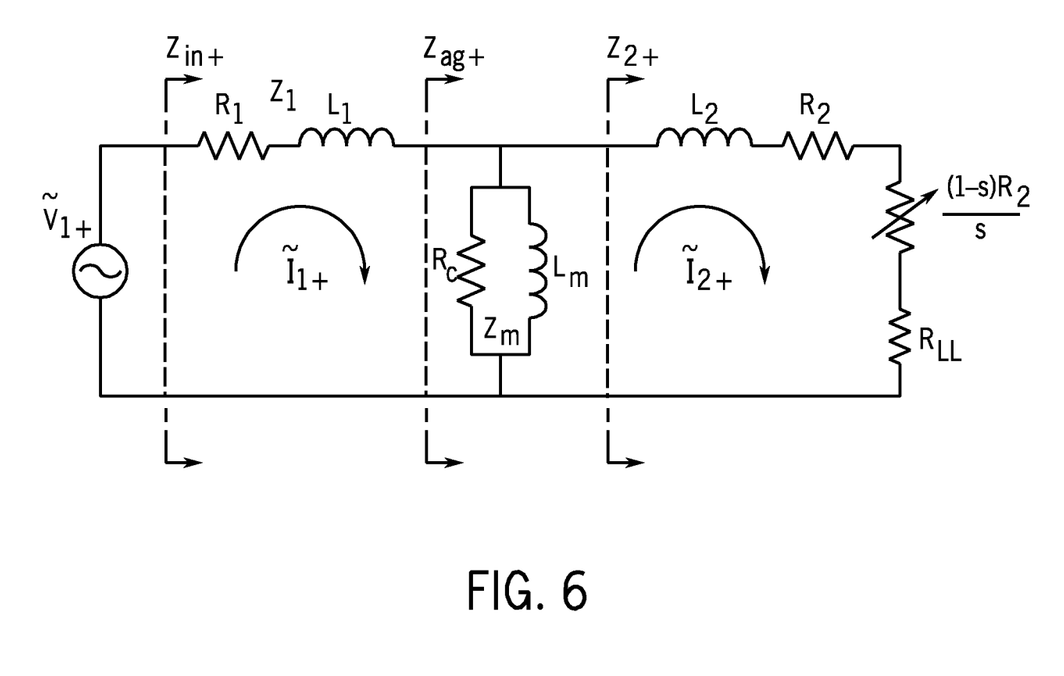
FIG. 6 is an exemplary equivalent circuit used for the determination of motor efficiency set forth in FIG. 5 according to one embodiment of the invention.
Figure 7:
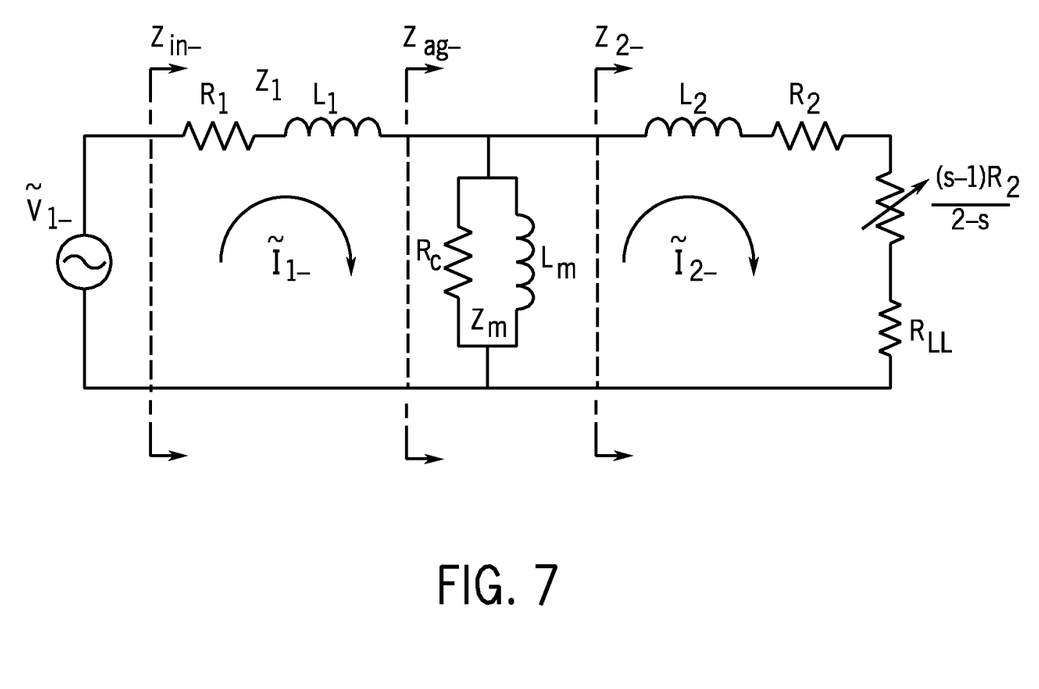
FIG. 7 is another exemplary equivalent circuit used for the determination of motor efficiency set forth in FIG. 5 according to one embodiment of the invention.

FIG. 6 is an example of an equivalent circuit determined at 126 of FIG. 5 according to an embodiment of the invention. In particular, FIG. 6 illustrates a modified induction motor positive-sequence equivalent circuit with an added equivalent stray-load resistor, $R_{LL}$, that may be determined according to the relationship shown in Eqn. 13 shown below. FIG. 7 is another example of an equivalent circuit that may be determined at 126. However, the exemplary equivalent circuit of FIG. 7 is a modified induction motor negative-sequence equivalent circuit with an added equivalent stray-load resistor, $R_{LL}$. Again, as with the equivalent circuit discussed above with respect to FIG. 6, $R_{LL}$ may be ignored in the equivalent circuit of FIG. 7 may be determined according Eqn. 13 shown below. With regard to both FIGS. 6 and 7, $\tilde{V}_1$ is the stator phase voltage phasor. $\tilde{I}_1$ and $\tilde{I}_2$ are the stator and rotor phase current phasors, respectively. $R_1$, $R_2$, and $R_C$ are the stator, rotor, and core resistances, respectively, and $X_1$, $X_2$, and $X_m$ are the stator leakage, rotor leakage, and magnetizing reactances, respectively. The subscripts "+" and "−" represent the positive- and negative-sequence components respectively. Further, the reactances mentioned above may instead be inductances.

For many motors, the effect of a negative sequence may be ignored when determining an equivalent circuit because the negative sequence components in the utility voltage are often small and the induction motor windings are often close to perfect. As such, in one embodiment only a positive-sequence equivalent circuit, such the one shown in FIG. 6, is determined at 126 of FIG. 5. However, in another embodiment, where an induction motor operates under unbalanced conditions, it may be beneficial to also determine a negative-sequence equivalent circuit such as the one shown in FIG. 7.

With regard to FIGS. 6 and 7, $R_{LL}$ may be determined using the following relationship:

$$R_{LL} = \frac{W_{LLr\_rated}}{3I_{2\_rated}^2} = const., \qquad \text{(Eqn. 15)}$$

where $I_{2\_rated}$ refers to the rated rotor current referred from the stator side (see, e.g., Eqn. 11 above). Variables with a subscript of one, e.g., $R_1$, reference the stator, and variables with a subscript of two, e.g., $R_2$, reference the rotor. In addition, the variables in FIGS. 6 and 7 are each referenced from the stator side. For example, $R_2$ refers to the rotor current referenced from the stator side. In one embodiment, since the stray-load loss is primarily determined by the rotor current, the rated rotor stray-load loss, $W_{LLr\_rated}$, may be determined using the assumed stray-load values defined in IEEE Std-112 (see, e.g., Table 1 above).

Referring back to FIG. 5, based on the one or more equivalent circuits determined at 126, at least four independent equations are determined at 128. That is, two independent equations are determined for each operating point or load. For example, with regard to the exemplary equivalent circuit shown in FIG. 6, the impedance terms are defined with the following constraints (the subscript "+" has been dropped for simplicity):

$$Z_1 = R_1 + j\omega L_1, \qquad \text{(Eqn. 16)}$$

$$Z_2 = \frac{R_2}{s} + R_{LL} + j\omega L_2, \qquad \text{(Eqn. 17)}$$

and $$Z_m = R_C \,//\, j\omega L_m = \frac{j\omega R_C L_m}{R_C + j\omega L_m}. \qquad \text{(Eqn. 18)}$$

Considering that the stator resistance and slip are known from motor voltages and currents as previously discussed with respect to FIG. 2, and that stator and rotor leakage inductances have a specific or fixed ratio (e.g., 1.0, 0.67, or 0.43) for a certain NEMA design code (i.e., a motor design code) or rotor type, the input impedance can be expressed as a function of only four independent unknown parameters: $L_1$, $R_C$, $L_m$, and $R_2$. As such, $$\begin{aligned} Z_{in} &= Z_1 + Z_{ag} \\ &= Z_1 + Z_m \,//\, Z_2 \\ &= Z_1 + \frac{Z_m Z_2}{Z_m + Z_2} \\ &= f(L_1, R_C, L_m, R_2). \end{aligned} \qquad \text{(Eqn. 19)}$$

Thus, by separating the real and imaginary parts of Eqn. 19, two independent equations can be obtained for each motor operating point:

$$\text{real}(Z_{in}) = \text{real}[f(L_1, R_C, L_m, R_2)] = \text{real}\left(\frac{\tilde{V}_1}{\tilde{I}_1}\right), \quad \text{(Eqn. 20)}$$

and $$\text{imag}(Z_{in}) = \text{imag}[f(L_1, R_C, L_m, R_2)] = \text{imag}\left(\frac{\tilde{V}_1}{\tilde{I}_1}\right). \quad \text{(Eqn. 21)}$$

In other words, a set of two independent equations or constraints (e.g., Eqns. 20 and 21) may be determined for each of the two or more motor operating points. As such, if two operating points are used, four equations are obtained. Accordingly, to determine the at least four independent equations at 128, the at least four equations are expanded. For example, the expansion of Eqns. 20 and 21, relating to one operating point, may be expanded as follows:

(Eqns. 22 and 23, respectively)

$$\left\{ \text{real}\left(\frac{\tilde{V}_1}{\tilde{I}_1}\right) = R_1 + \frac{\left[R_C X_m + \frac{R_C X_1}{k} + \left(\frac{R_2}{s} + R_{LL}\right) X_m\right] - \frac{R_C X_m X_1}{k}\left[R_C\left(\frac{R_2}{s} + R_{LL}\right) - \frac{X_m X_1}{k}\right]}{\left[R_C\left(\frac{R_2}{s} + R_{LL}\right) - \frac{X_m X_1}{k}\right]^2 + \left[R_C X_m + \frac{R_C X_1}{k} + \left(\frac{R_2}{s} + R_{LL}\right) X_m\right]^2} \right.$$

$$\left. \text{imag}\left(\frac{\tilde{V}_1}{\tilde{I}_1}\right) = X_1 + \frac{\frac{(R_C X_m X_1)}{k}\left[R_C X_m + \frac{R_C X_1}{k} + \left(\frac{R_2}{s} + R_{LL}\right) X_m\right] + R_C X_m\left(\frac{R_2}{s} + R_{LL}\right)\left[R_C\left(\frac{R_2}{s} + R_{LL}\right) - \frac{X_m X_1}{k}\right]}{\left[R_C\left(\frac{R_2}{s} + R_{LL}\right) - \frac{X_m X_1}{k}\right]^2 + \left[R_C X_m + \frac{R_C X_1}{k} + \left(\frac{R_2}{s} + R_{LL}\right) X_m\right]^2}. \right.$$

Likewise, the remainder of the four independent equations (i.e., the two independent equations relating to the second operating point) may be determined.

Once the at least four independent equations are determined at 128, the unknown motor parameters or variables of the four determined independent equations may be solved at 130. A variety of techniques may be used to solve such a nonlinear and multi-dimensional system of equations, a few of which will be discussed with respect to embodiments described below. It is contemplated that instruction for such techniques may be stored in a memory module such as memory module 19 of FIG. 1.

At 132, FIG. 5, the solutions (i.e., the motor parameters) to the four independent equations determined at 130 are used to determine the motor efficiency. For example, the following relationship may be used to determine the motor efficiency at 132:

$$\eta = \frac{P_{output}}{P_{input}} \quad \text{(Eqn. 24)}$$

$$= \frac{3|\tilde{I}_2|^2 \frac{(1-s)}{s} R_2 - W_{fw}}{3|\tilde{I}_1|^2 \text{real}(Z_{in})}$$

$$= \frac{3\left|\tilde{I}_1\left(\frac{Z_m}{Z_m + Z_2}\right)\right|^2 \frac{(1-s)}{s} R_2 - W_{fw}}{3|\tilde{I}_1|^2 \text{real}(Z_{in})},$$

where $\eta$ is the motor efficiency, and according to techniques known in the art the friction and windage loss, $W_{fw}$, may be taken as a constant percentage of the rated horse power (e.g., 1.2% for 4-pole motors below 200 hp). As such, Eqn. 9 set forth above may be employed. Accordingly, an instantaneous motor efficiency can be determined without implementing a no-load test and without the use of output sensors internal or external to the electric motor.

As mentioned above, a variety of techniques may be used to solve for the unknown motor parameters at 130. For example, in one embodiment, a numerical technique such as Newton's method is implemented by a processor or the like to solve for the unknown motor parameters. An implementation of such an embodiment uses the computation of a 4×4 Jacobian matrix, as in the following:

$$J(x) = \partial g(x)/\partial x, \quad \text{(Eqn. 25)}$$

where x in J(x) is a four-dimensional vector with four unknown motor parameters as components. The computation of partial differentiations is not needed for each iteration. In order to avoid a convergence that is too rapid, a reasonable initial point can be obtained from estimations or approximations. For example, the stator leakage reactance, $X_1$, and the magnetizing reactance, $X_m$, obey the following relation:

$$X_1 = \alpha \cdot X_m, \quad \text{(Eqn. 26)}$$

where the ratio $\alpha$ is a constant ranging from, for example, approximately 0.02 to 0.07 for a particular motor. Further, the magnitude of no-load current, $I_{1\_NL}$, can, for example, be estimated as a certain percent of full-load current (e.g., 25% to 30%). As such, the magnitude of the no-load input impedance, $|Z_{in\_NL}|$, can be obtained using the following relationship:

$$|Z_{in\_NL}| = \frac{V_{1\_NL}}{I_{1\_NL}}. \quad \text{(Eqn. 27)}$$

Still further, considering the core-loss resistance, $R_C$, is often large and its contribution in $|Z_{in\_NL}|$ is often negligible, the no-load reactance may, for example, be estimated by the following relationship:

$$X_1 + X_m \approx \sqrt{|Z_{in\_NL}|^2 - R_1^2}. \quad \text{(Eqn. 28)}$$

Accordingly, in light of the estimations and corresponding Eqns. 26 to 28, the initial estimation of $X_1$ can be determined as follows:

$$X_1 = \frac{\alpha}{\alpha + 1}\sqrt{\left(\frac{V_{1\_NL}}{I_{1\_NL}}\right)^2 - R_1^2}. \quad \text{(Eqn. 29)}$$

Still referring to the approximations, the initial estimation of $R_C$ can be set as one order of magnitude larger than $X_m$. The rotor resistance, $R_2$, can be set in the same order of magnitude as $R_1$. Accordingly, by using the estimations or approximations described above, the technique using Newton's method may lead to convergence. In is noted, however, the approximations set forth above are only examples according to one embodiment of the invention. In other embodiments of the invention, other approximations may be used, as those skilled in the art will recognize, which also lead to convergence.

In one embodiment, if Newton's method does not produce results within a desired range of error, one or more other numerical solving techniques may be implemented. For example, though Newton's method is a preferable solution technique because of its simplicity and often fast convergence, a Particle Swarm Optimization (PSO, as known by those skilled in the art) or a simulated annealing technique may be implemented to produce solutions at 130.

The simulated annealing technique mentioned immediately above is a statistical optimization technique that searches for a global minimum of the objective function. The method utilizes two stages to reach the global optimization. The first stage is a random global search based on the simulated annealing of metal. That is, according to an annealing analogy, as the temperature of a metal is gradually lowered from above its melting point, the atoms lose thermal mobility and decay to lower energy states. Eventually, the atoms settle into a minimum global energy state. The simulated annealing methods simulate this annealing process by gradually lowering an artificial temperature T. The energy states of artificial atoms are associated with x, which is a vector. Their changes, $\Delta x$, are described using a Gaussian distribution with zero mean. The convergence speed of simulated annealing is often accelerated by considering lower and upper bonds on x and f(x). A localization parameter, $0<\gamma<1$, is set empirically to adjust the scope of searching local minima.

The second stage of the simulated annealing technique is an efficient local search. Many local minimum optimization methods can be utilized, such as the conjugate-gradient method and the penalty function method.

With regard to solving for the four unknown motor parameters at 130 using the simulated annealing method, a root finding process for the nonlinear 4-dimensional system of equations can be converted to an optimization process using the simulated annealing method as follows:

Minimize: $f(x)=\|g(x)\|^2=g(x)'g(x)$

Subject to: $a<x<b$. (Eqn. 30)

A localization parameter of $\gamma=0.3-0.5$ provides a good convergence speed. However, other localization parameters, $\gamma$, may also provide adequate convergence speed. The lower and upper bonds vectors, a and b, can be estimated from motor nameplate data or information, as known by those skilled in the art.

Each of the techniques discussed above allows for a set of solutions to be determined for the operating parameters of the equivalent circuit from only stator voltage, current phasors, and motor nameplate data (i.e., motor rating data). Further, the three techniques (i.e., Newton's method, PSO, and simulated annealing) ensure that a solution for each parameter under various conditions.

As discussed above, these techniques (i.e., Newton's method, PSO, and simulated annealing) may be used to solve for the motor parameters at 130 of FIG. 5 such that the instantaneous motor efficiency may be determined at 132. However, it is contemplated that other embodiments may employ other solving techniques instead of, or in conjunction with, those discussed above such that the solutions for the motor parameters may be determined at 130.

In addition, though embodiments discussed with respect to FIG. 5 have been described in the context of three-phase induction motors, it will be appreciated by those skilled in the art that embodiments of FIG. 5 are also equally applicable to induction motors with more or less than three phases. For example, embodiments of FIG. 5 would also be applicable to single-phase motors.

A technical contribution for the disclosed method and apparatus is that it provides for a processor implemented to determine a motor efficiency based on nonintrusive techniques that rely on measured input current and voltage and a determination of output power.

In accordance with one embodiment, a motor efficiency monitoring system includes a processor programmed to determine efficiency of an electric motor under load while the electric motor is online. The determination of motor efficiency is independent of a rotor speed measurement. Further, the efficiency is based on a determination of stator winding resistance, an input voltage, and an input current. The determination of the stator winding resistance occurs while the electric motor under load is online In accordance with another embodiment, a computer readable storage medium having stored thereon a computer program comprising instructions, which, when executed by a computer, cause the computer to determine an input power of an operating electric motor online, determine an output power of the operating electric motor online, and determine a motor efficiency of the operating electric motor online. The determination of the motor efficiency is based on the motor input power and the output power. The determination of the output power is based on a determination of a stator resistance. Further, the determination of the stator resistance is based on at least one of a motor input power, a motor input current, and a rotor speed.

In accordance with yet another embodiment, a method for determining a motor efficiency includes determining a voltage input into a stator of an electric motor in operation, determining a stator resistance of the electric motor in operation based on the voltage, and determining the motor efficiency of the electric motor in operation independent of a stator resistance measurement. Determining the instantaneous motor efficiency is based on the voltage, the stator resistance, and a rotor speed.

The invention has been described in terms of embodiments, and it is recognized that equivalents, alternatives, and modifications, aside from those expressly stated, are possible and within the scope of the appending claims.

What is claimed is:

1. A non-transitory computer readable storage medium having stored thereon a computer program comprising instructions, which when executed by a computer, cause the computer to:
   determine an input voltage and current at a first operating point of an online induction motor;
   determine an input voltage and current at a second operating point of the online induction motor;
   determine at least one modified equivalent circuit based on voltage and current phasors corresponding to the input voltages and currents at the first and second load points;
   calculate a plurality of motor parameters from the at least one modified equivalent circuit; and
   determine a motor efficiency of the online induction motor based on the plurality of calculated motor parameters;
   wherein the modified equivalent circuit comprises a positive-sequence equivalent circuit with an added equivalent stray-load resistor.

2. The non-transitory computer readable storage medium of claim 1 wherein the instructions further cause the computer to determine at least four independent equations from the at least one equivalent circuit.

3. The non-transitory computer readable storage medium of claim 2 wherein the at least four independent equations comprises two independent equations for each of the first operating point and the second operating point.

4. The computer readable storage medium of claim 2 wherein the instructions further cause the computer to apply at least one numerical solving technique to the at least four independent equations to determine the plurality of motor parameters.

5. The computer readable storage medium of claim 1 wherein the instructions further cause the computer to:
   determine an input voltage and current at additional operating points of the online induction motor; and
   apply a Least Squares Estimation (LSE) regression to the input voltages and currents from the first operating point, second operating point, and additional operating points of the online induction motor to determine the at least one equivalent circuit.

6. The non-transitory computer readable storage medium of claim 1 wherein the plurality of motor parameters comprises a core resistance, a rotor resistance, one of a magnetizing inductance and a magnetizing reactance, and one of a stator leakage inductance and a stator leakage reactance.

7. A method for determining efficiency of an induction motor, the method comprising:
   determining a voltage and current input into an induction motor during operation thereof at each of at least two motor operating points, wherein each motor operating point comprises a distinct percentage of a maximum rated operating load;
   determining voltage and current phasors associated with the voltage and current inputs;
   determining an equivalent circuit based on the voltage and current phasors;
   determining a plurality of independent equations based upon the equivalent circuit, the plurality of independent equations having a set of motor parameters associated therewith; and
   solving the plurality of independent equations for the set of motor parameters to determine a motor efficiency of the induction motor;
   wherein the set of motor parameters comprises a core resistance, a rotor resistance, a stray-load loss, one of a magnetizing inductance and a magnetizing reactance, and one of a stator leakage inductance and a stator leakage reactance; and
   wherein solving for the set of motor parameters comprises assuming a fixed ratio between the one of the stator leakage inductance and stator leakage reactance and a respective one of a rotor leakage inductance and a rotor leakage reactance based on at least one of a motor design code and a rotor type of the induction motor.

8. The method of claim 7 wherein the equivalent circuit is based only on the input voltage and input current acquired at the at least two motor operating points and on motor nameplate data.

9. The method of claim 7 wherein solving the plurality of independent equations comprises applying at least one numerical solving technique to the plurality of independent equations, the at least one numerical solving technique being one of Newton's method, Particle Swarm Optimization, and simulated annealing.

10. A non-transitory computer readable storage medium having stored thereon a computer program comprising instructions, which when executed by a computer, cause the computer to:
   determine an input voltage and current at each of a first operating point and a second operating point of an online induction motor, wherein each of the first and second operating points comprises a distinct percentage of a maximum rated operating load;
   determine voltage and current phasors associated with the voltage and current inputs;
   determine an equivalent circuit based on the voltage and current phasors;
   determine four independent equations from the one equivalent circuit, the independent equations having a set of motor parameters associated therewith;
   calculate a plurality of motor parameters from the at least one modified equivalent circuit, the plurality of motor parameters comprising a core resistance, a rotor resistance, one of a magnetizing inductance and a magnetizing reactance, and one of a stator leakage inductance and a stator leakage reactance;
   assume a fixed ratio between the one of the stator leakage inductance and stator leakage reactance and a respective one of a rotor leakage inductance and a rotor leakage reactance based on at least one of a motor design code and a rotor type of the induction motor; and
   determine a motor efficiency of the online induction motor based on the plurality of calculated motor parameters.

11. The non-transitory computer readable storage medium of claim 10 wherein the computer is further programmed to solve the four independent equations to determine the motor efficiency of the online induction motor.

12. The non-transitory computer readable storage medium of claim 11 wherein the computer is further programmed to solve the four independent equations comprises applying at least one numerical solving technique to the four independent equations, the at least one numerical solving technique being one of Newton's method, Particle Swarm Optimization, and simulated annealing.

13. The non-transitory computer readable storage medium of claim 10 wherein the equivalent circuit is based only on the input voltage and input current acquired at the first and second motor operating points and on motor nameplate data.

14. A non-transitory computer readable storage medium having stored thereon a computer program comprising instructions, which when executed by a computer, cause the computer to:
   determine an input voltage and current at a first operating point of an online induction motor;
   determine an input voltage and current at a second operating point of the online induction motor;
   determine at least one modified equivalent circuit based on voltage and current phasors corresponding to the input voltages and currents at the first and second load points;
   calculate a plurality of motor parameters from the at least one modified equivalent circuit; and
   determine a motor efficiency of the online induction motor based on the plurality of calculated motor parameters;
   wherein the modified equivalent circuit comprises a negative-sequence equivalent circuit with an added stray-load resistor.

* * * * *